(12) United States Patent
Kaufman et al.

(10) Patent No.: US 8,321,187 B2
(45) Date of Patent: Nov. 27, 2012

(54) PROCESS SIMULATION UTILIZING COMPONENT-SPECIFIC CONSUMPTION DATA

(75) Inventors: Philip John Kaufman, Milwaukee, WI (US); Marcia Elaine Walker, Durham, NC (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 495 days.

(21) Appl. No.: 12/429,860

(22) Filed: Apr. 24, 2009

(65) Prior Publication Data

US 2010/0274367 A1   Oct. 28, 2010

(51) Int. Cl.
*G06G 7/48* (2006.01)
(52) U.S. Cl. .......... 703/6; 703/13; 700/31; 700/291
(58) Field of Classification Search .......... 703/1, 6, 703/13; 700/31, 291
See application file for complete search history.

(56) References Cited

U.S. PATENT DOCUMENTS

| | | | |
|---|---|---|---|
| 4,827,395 A | 5/1989 | Anders et al. |
| 5,924,486 A | 7/1999 | Ehlers et al. |
| 6,012,053 A | 1/2000 | Pant et al. |
| 6,321,983 B1 | 11/2001 | Katayanagi et al. |
| 6,633,823 B2 | 10/2003 | Bartone et al. |
| 6,701,298 B1 | 3/2004 | Jutsen |
| 6,785,592 B1 | 8/2004 | Smith et al. |
| 6,857,020 B1 | 2/2005 | Chaar et al. |
| 7,043,316 B2 | 5/2006 | Farchmin et al. |
| 7,451,019 B2 | 11/2008 | Rodgers |
| 7,565,351 B1 | 7/2009 | Callaghan |
| 7,587,251 B2 | 9/2009 | Hopsecger |
| 7,788,189 B2 | 8/2010 | Budike, Jr. |
| 2002/0013744 A1 | 1/2002 | Tsunenari et al. |
| 2002/0066072 A1 | 5/2002 | Crevatin |
| 2002/0099464 A1 | 7/2002 | O'Connor et al. |
| 2002/0099804 A1 | 7/2002 | O'Connor et al. |
| 2002/0178047 A1 | 11/2002 | Or et al. |
| 2003/0014500 A1 | 1/2003 | Schleiss |
| 2003/0028527 A1 | 2/2003 | Crosby et al. |
| 2003/0061091 A1 | 3/2003 | Amaratunga et al. |
| 2003/0110065 A1* | 6/2003 | Twigge-Molecey .............. 705/7 |
| 2003/0171851 A1 | 9/2003 | Brickfield et al. |
| 2004/0158506 A1 | 8/2004 | Wille |
| 2004/0199294 A1 | 10/2004 | Fairlie et al. |
| 2004/0205412 A1 | 10/2004 | Staron et al. |

(Continued)

FOREIGN PATENT DOCUMENTS

EP   0977137 A2   2/2000

(Continued)

OTHER PUBLICATIONS

Kouloura et al, A Systems Approach to Corporate Sustainability in Energy Management of Industrial Units, IEEE Systems Journal, vol. 2, No. 4, Dec. 2008, pp. 442-452.*

(Continued)

*Primary Examiner* — Russell Frejd
(74) *Attorney, Agent, or Firm* — Fletcher Yoder P.C.; William R. Walbrun; John M. Miller

(57) ABSTRACT

Methods and apparatuses are provided for simulating components and processes using discrete, variable-granularity, component-specific data relating to energy consumption or other sustainability factors. Simulations can be analyzed and optimized to facilitate forecasting of sustainability factors and determine advantageous modifications to the components or processes.

21 Claims, 6 Drawing Sheets

U.S. PATENT DOCUMENTS

| | | | |
|---|---|---|---|
| 2004/0249697 A1 | 12/2004 | Ohnemus et al. | |
| 2004/0260489 A1 | 12/2004 | Mansingh et al. | |
| 2005/0015287 A1* | 1/2005 | Beaver | 705/7 |
| 2005/0034023 A1 | 2/2005 | Maturana et al. | |
| 2005/0065971 A1 | 3/2005 | Honda | |
| 2005/0143865 A1 | 6/2005 | Gardner | |
| 2005/0144154 A1 | 6/2005 | Demesa et al. | |
| 2005/0171910 A1 | 8/2005 | Wu et al. | |
| 2005/0198333 A1 | 9/2005 | Dinges | |
| 2005/0278296 A1 | 12/2005 | Bostwick | |
| 2006/0026145 A1 | 2/2006 | Beringer et al. | |
| 2006/0248002 A1 | 11/2006 | Summer et al. | |
| 2007/0038646 A1 | 2/2007 | Thota | |
| 2008/0046387 A1 | 2/2008 | Gopal et al. | |
| 2008/0046407 A1 | 2/2008 | Shah et al. | |
| 2008/0059457 A1 | 3/2008 | Ohnemus et al. | |
| 2008/0079560 A1 | 4/2008 | Hall et al. | |
| 2008/0127779 A1* | 6/2008 | Morales Cerda et al. | 75/743 |
| 2008/0154749 A1 | 6/2008 | D'hooghe et al. | |
| 2008/0255899 A1 | 10/2008 | McConnell et al. | |
| 2008/0272934 A1 | 11/2008 | Wang et al. | |
| 2009/0083843 A1 | 3/2009 | Wilkinson, Jr. et al. | |
| 2009/0099887 A1* | 4/2009 | Sklar et al. | 705/7 |
| 2009/0132176 A1 | 5/2009 | McConnell et al. | |
| 2009/0138415 A1 | 5/2009 | Lancaster | |
| 2009/0177505 A1 | 7/2009 | Dietrich et al. | |
| 2009/0222307 A1* | 9/2009 | Beaver | 705/7 |
| 2010/0023360 A1 | 1/2010 | Nadhan | |
| 2010/0042455 A1 | 2/2010 | Liu et al. | |
| 2010/0088136 A1 | 4/2010 | Cheng et al. | |
| 2010/0138003 A1 | 6/2010 | August et al. | |
| 2010/0217642 A1 | 8/2010 | Crabtree et al. | |
| 2010/0217651 A1 | 8/2010 | Crabtree et al. | |
| 2010/0218108 A1 | 8/2010 | Crabtree et al. | |
| 2010/0249975 A1 | 9/2010 | Rezayat | |
| 2010/0262445 A1 | 10/2010 | DeSorbo | |
| 2010/0274377 A1* | 10/2010 | Kaufman et al. | 700/103 |
| 2010/0274602 A1* | 10/2010 | Kaufman et al. | 705/7 |
| 2010/0274603 A1* | 10/2010 | Walker et al. | 705/7 |
| 2010/0274611 A1 | 10/2010 | Kaufman et al. | |
| 2010/0274612 A1* | 10/2010 | Walker et al. | 705/8 |
| 2010/0274629 A1 | 10/2010 | Walker et al. | |
| 2010/0274810 A1* | 10/2010 | Walker et al. | 707/780 |
| 2010/0275147 A1* | 10/2010 | Kaufman et al. | 715/771 |
| 2010/0332373 A1 | 12/2010 | Crabtree et al. | |
| 2011/0046800 A1 | 2/2011 | Imes et al. | |
| 2011/0172838 A1 | 7/2011 | Pai et al. | |
| 2011/0273022 A1 | 11/2011 | Dennis et al. | |

FOREIGN PATENT DOCUMENTS

| | | |
|---|---|---|
| WO | 2004074954 A2 | 9/2004 |
| WO | 2008011427 A2 | 1/2008 |

OTHER PUBLICATIONS

Yang et al, Eco-Design for Product Lifecycle Sustainability, IEEE International Conference on Industrial Informatics, 2006, pp. 548-553.*

GE Energy. "Energy and Asset Performance—Fact Sheet." Sep. 2005. General Electric Company. Published online at [http://www.gepower.com/prod_serv/serv/industrial_service/en/downloads/gea14163_eap.pdf], retrieved Apr. 13, 2009. 2 pages.

ABB. "Energy Management Solution for the Process Industry—Energy Management and Optimization." Apr. 6, 2007. Published online at [http://library.abb.com/global/scot/scot313.nsf/veritydisplay/5e48efb88a7e1cbac125734600737b02/$File/3BFI405000R4001_en_Energy_Management_and_Optimization_3.5.pdf], retrieved Apr. 13, 2009. 12 pages.

ABB. "Energy Management and Optimization for the Process Industries—Advanced IT Tools for Planning, Monitoring, Controlling, and Reporting Energy System Operations." Published online at [http://library.abb.com/global/scot/scot296.nsf/veritydisplay/bd2a898a24267c46c12571c70070a851/$File/3BFI402000R3001_en_Advanced_IT_Tools_for_Energy_Management.pdf], retrieved Apr. 13, 2009. 6 pages.

European Search Report for European Application No. 10160585.5-1527 / 2254061 dated Dec. 20, 2010, 9 pages.

OA dated Feb. 16, 2011 for U.S. Appl. No. 12/429,813, 21 pages.

Dietmair A, et al., "Energy Consumption Modeling and Optimization for Production Machines". Sustainable energy technologies, 2008. ICSET 2008. IEEE International Conference on IEEE, Piscataway, NJ, USA, Nov. 24, 2008, pp. 574-579, XP031442235, ISBN: 978-1-4244-1887-9.

European Search Report for European Patent Application No. 10160649.9-1238 dated Sep. 23, 2010, 8 pages.

European Search Report for European Patent Application No. 10160581.4-1238 dated Sep. 23, 2010, 8 pages.

European Search Report for European Patent Application No. 10160673.9-1238 dated Sep. 23, 2010, 9 pages.

Kiritsis D, et al., Research issues on product lifecycle management and information tracking using smart embedded systems. Advanced Engineering Informatics, Elsevier Lnkd-DOI : 10.1016/J. AEI.2004.09.005, vol. 17, No. 3-4, Jul. 1, 2003, pp. 189-202, XP004595481 ISSN: 1474-0346.

Y-S Ma, et al., Product Lifecycle Analysis and Optimization in an Eco-value Based, Sustainable and Unified Approach. Industrial Informatics, 2006 IEEE International Conference on, IEEE, PI, Aug. 1, 2006, pp. 537-541 XP031003409, ISBN: 978-0-7803-9700-2.

Seref Erkayhan Ed—Ding Zhen-Hua et al., The Use of RFID enables a holistic Information Management within Product Lifecycle Management (PLM). RFID Eurasia, 2007 1st Annual, IEEE, PI Sep. 1, 2007, pp. 1-4, XP031153342. ISBN: 978-975-1-5660-1.

European Search Report for European Patent Application No. 10160811.5 dated Sep. 20, 2010, 9 pages.

European Search Report dated Nov. 4, 2010 for European Patent Application No. EP 10 16 0737, 9 pages.

European Search Report completed Aug. 6, 2010 for European Patent Application No. EP 10 16 0810, 2 pages.

EPO : Notice from the European patent Office dated Oct. 1, 2007 concerning business methods. Official Journal of the European Patent Office, vol. 30, No. 11, Nov. 1, 2007, pp. 592-593.

Kennedy, Pat, et al., "In Pursuit of the Perfect Plant—A Business and Technical Guide", Apr. 2008, Chapter 9—Energy Management, pp. 251-283; published by Evolved Technologist Press, New York, New York, USA.

U.S. Appl. No. 13/275,983, filed Oct. 18, 2011, David D. Brandt.

* cited by examiner

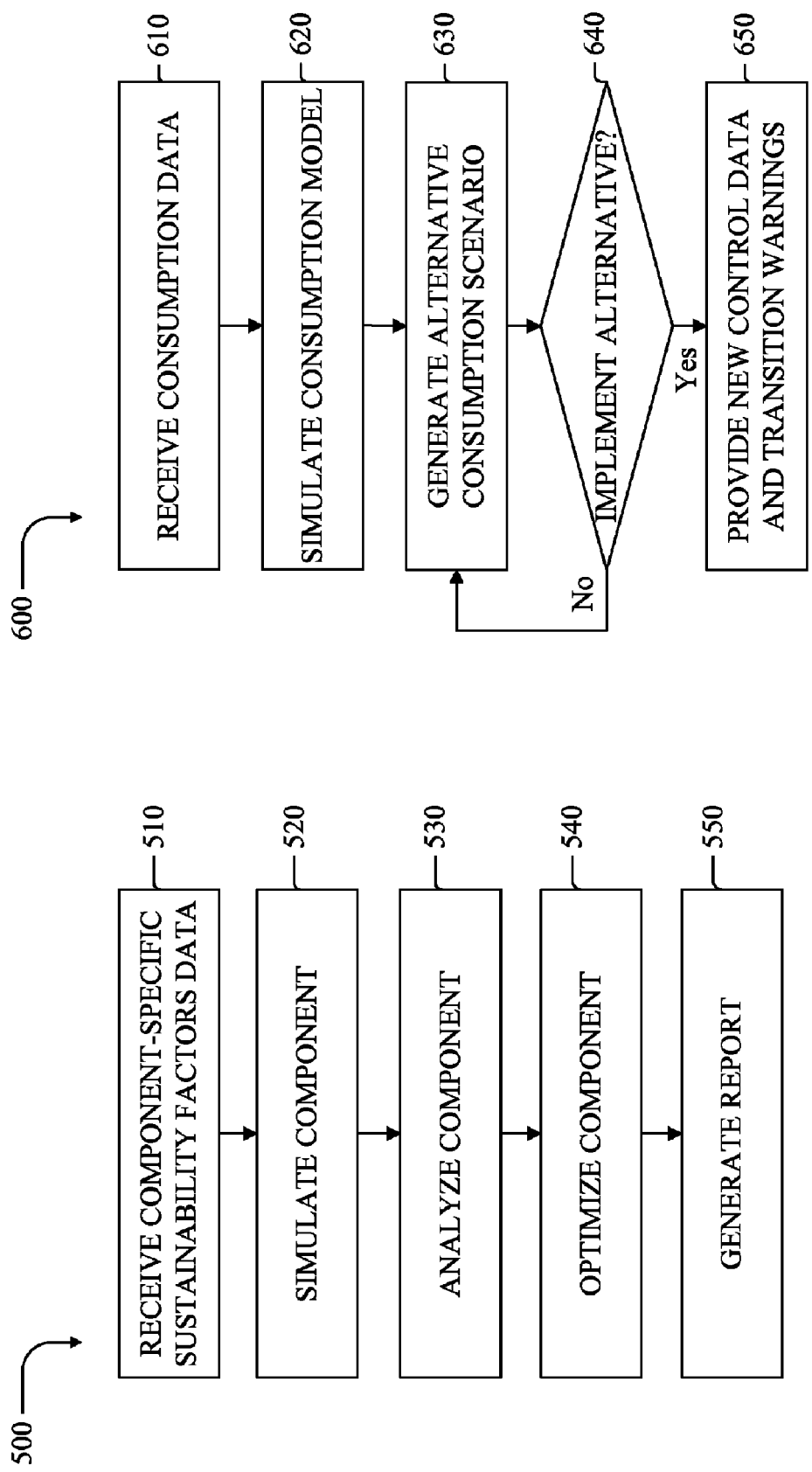

PROCESS SIMULATION UTILIZING COMPONENT-SPECIFIC CONSUMPTION DATA

TECHNICAL FIELD

The claimed subject matter relates generally to industrial control systems and more particularly to simulation based on energy or environmental costs associated with particular elements of a system.

BACKGROUND

Businesses are becoming increasingly aware of the whole spectrum of resources employed by their operations. Due in part to government regulation, tax treatment, enterprise efficiency and changes in goodwill, facilities must now take into account how all types of sustainability factors affect their organization's expenses and practices. For example, a manufacturing plant cannot focus exclusively on raw material and equipment. To comply with regulation, secure favorable pricing and avoid penalties, businesses must consider sustainability factors such as the rate and timing of energy use and the generation of byproducts such as carbon emissions.

To address regulatory, economic and environmental issues, many companies continue to monitor and attempt to forecast activities and events that impact their sustainability. Current monitoring generally considers high-level energy and byproduct totals, but may lack a comprehensive view of other sustainability factors. In some instances, these totals are calculated to per-area metrics for a facility. Future quantities used and produced are estimated based predominantly on seasonal historical data. These estimates can be very inaccurate and are susceptible to sizeable inconsistencies. Errors in resulting approximations can result in decreased efficiency, increased expenses and operational bottlenecks.

Software packages such as Pavilion™ Real-time Environmental Management and Software CEM™ are targeted to mitigate specific concerns such as emissions compliance. The Pavilion software can measure emissions from multiple sources within a facility to provide continuous calculation and scheduled reporting, and can facilitate data processing via analytical engines to provide predictive emissions monitoring. However, managers can benefit from complete information describing not only emissions, but other sustainability factors and their interrelationships.

Accordingly, one challenge presented by the existing estimations is the difficulty in fully appreciating one or more impacts of individual processes or components on energy and other sustainability factors. For example, it may be difficult for a company to determine the appropriate productivity to maximize the value of an emissions credit because emissions may not vary with total production in a predictable fashion. In this case, evaluation of an entire facility may provide alternative valuation to techniques focusing exclusively on emissions-generating components. In another example, a plant performing changes to its processes may spike their peak energy use and incur a penalty. General overhead estimations may not provide sufficient planning context to allow for informed decision-making on sustainability factors. It would therefore be beneficial to determine more accurate representations of the contribution or consumption associated with a specific component or process independently.

Another challenge exists in properly utilizing facility information. Simulation tools are often used by engineers and managers to perceive the flow and consumables of facility activity. However, sustainability factors for industrial plants are typically viewed from a top-down perspective that often makes it difficult to distinguish the source of certain expenditures. Accordingly, it would be useful to enable a component-specific modeling and simulation environment to improve understanding of particular processes or components on consumption and sustainability factors.

SUMMARY OF THE INVENTION

The following summary presents a simplified overview to provide a basic understanding of certain aspects described herein. This summary is not an extensive overview nor is it intended to identify critical elements or delineate the scope of the aspects described herein. The sole purpose of this summary is to present some features in a simplified form as a prelude to a more detailed description presented later.

Simulation tools and methods can be developed to include associating discrete consumption data and process-specific sustainability information with precise consumption points in a system or facility. Higher resolution and improved granularity are provided by attributing consumption and sustainability data to more particular processes or components and assembling models of the processes or components into comprehensive, dynamic simulations that help mitigate costs and provide greater support for decisions and procedures.

A dynamic simulation can be altered by a system or user input to discern the impact of possible changes on an enterprise, especially with respect to information relating to consumption or sustainability. The simulation response to changes can be used to improve forecasting, planning and alternate implementations. Additionally, the simulation can be optimized to determine advantageous alternatives to the current state of a production environment. Optimization can be directed towards a variety of scenarios, including changes in regulation, infrastructure or business relationships.

To the accomplishment of the foregoing and related ends, the following description and annexed drawings set forth in detail certain illustrative aspects. These aspects are indicative of but a few of the various ways in which the principles described herein can be employed. Other advantages and novel features may become apparent from the following detailed description when considered in conjunction with the drawings.

BRIEF DESCRIPTION OF THE DRAWINGS

FIG. 5 is a diagram illustrating an example method for optimization of a component with consideration for sustainability factors.

FIG. 6 is a diagram illustrating an example method for determination and implementation of alternative solutions for component consumption.

DETAILED DESCRIPTION OF THE INVENTION

Methods and apparatus are provided for analyzing, simulating and optimizing components using discrete, adaptable-resolution, component-specific data relating to sustainability factors including (but not limited to) energy consumption. In one aspect, the energies used and byproducts generated by a component in a specific application are modeled to allow more accurate and complete simulation of the component and its impact on a system or facility, and the system or facilities' operation, cost-containment, efficiency and/or regulatory compliance. Component-specific consumption data can be employed to simulate that component, which can be viewed in isolation or as a constituent of a plurality of components acting in concert and influencing one another.

Figure 1:
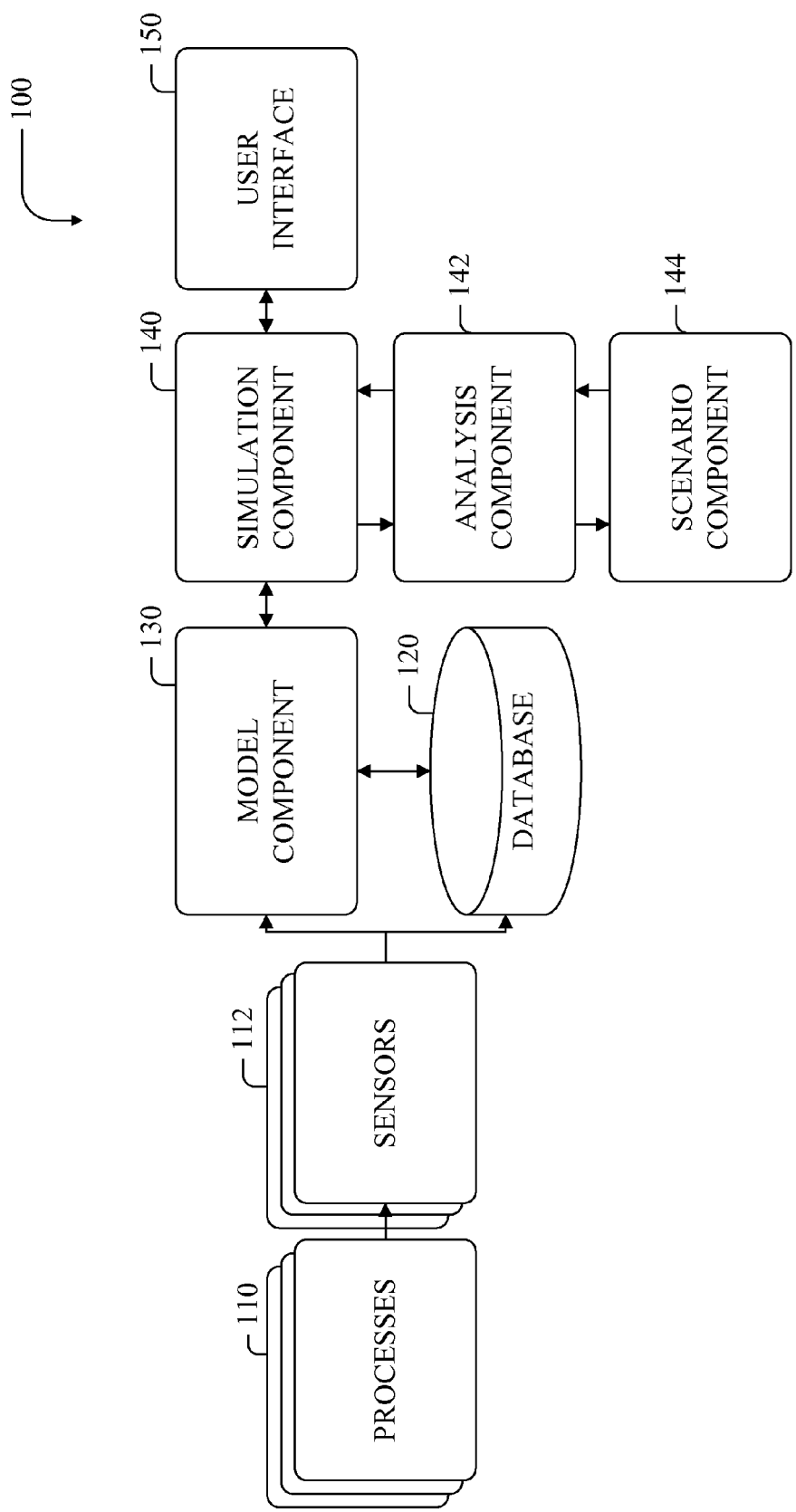
FIG. 1 is a schematic block diagram illustrating an example system for simulating a process using data from a sensor.

Referring initially to FIG. 1, an example system 100 illustrates a framework for simulating systems in terms of discrete, component-specific consumption data. Processes 110 operate in a live or real-time environment to allow measurement of consumption data. It is appreciated that processes 110 can be substantially any process, device, component or sub-component, set or subset, et cetera for which it is possible to measure, estimate or attribute consumption or impact to sustainability factors. Where possible, sensors 112 are operatively coupled to processes 110 to measure consumption data or an effect on sustainability factors. Sensors 112 can be operatively coupled to processes 110 in a variety of ways. For example, a multi-stage, multi-mode sensor can provide consumption data for a plurality of processes. Alternatively, a single sensor can be attached at a consumption point to detect sustainability factors for a sub-process.

Sensors 112 can measure, monitor or otherwise value consumption data or an effect on sustainability factors. For example, sensors 112 can be one or more of a power management tool, gas or fluid gauge, byproduct monitor, quality control, timer, serviceability or function check, or any device capable of valuing characteristics of a process or component. Sensors 112 can be permanently or temporarily installed, fixed or mobile, automatic or triggered externally, et cetera. Sensors 112 can store sensed data locally for later transmission or use, or transmit the data to another device for use or storage. Sensors 112 can communicate with other devices using a wide range of means, including direct connections, networks, one or more wireless standards, et cetera. Data from sensors 112 can be transmitted independently or piggy-backed onto other data transmissions. These example embodiments of sensors 112 are not exclusive and can be employed in combination to provide additional or redundant information on consumption and sustainability.

Sensors 112 provide consumption data and/or sustainability factor information to database 120. Database 120 can store consumption data in one or more formats suitable for processing, report generation, exporting, archiving, et cetera. Database 120 can be a single storage unit, or a plurality of connected, networked or distributed storage devices. Database 120 can include a plurality of redundant or semi-redundant databases or backup stores. Information in database 120 can be identified or associated with other information. Identification techniques can include time-stamping, inclusion of batch numbers, lot numbers, process or component identifiers, network identifiers, operator identifiers, random or pseudorandom data, et cetera. Identifying information can be associated with or incorporated into consumption data or sustainability factor information in database 120 or elsewhere. Identification information can later be interrogated to locate details associated with the consumption data or sustainability factor information.

Model component 130 uses consumption data and/or sustainability factor information from sensors 112 and/or database 120 to model processes 110. The model can be virtual, programmatic, software, electronic, et cetera. "Virtual," as used herein, is use to denote items represented or realized through hardware, software and other programmatic means rather than a concrete, physical reproduction. Data from sensors 112 and other information relating to processes 110 are used to represent processes 110 in one or more models. Models will typically be defined mathematically, but can incorporate qualitative or imprecise attributes where appropriate. Mathematical models can be stochastic or deterministic, steady-state or dynamic, continuous or discrete, local or distributed, et cetera. In some instances, multiple models can be used for a single process or component. A model created by model component 130 can calculate the discrete, component-specific inputs and outputs for any known or all discernible component applications.

Model component 130 can provision data for models from a plurality of sources, including but not limited to sensors 112 that are active at the time of model processing, stored information (from database 120 or elsewhere) previously recorded via sensors 112 (including now-inactive or subsequently-removed sensors), estimated data discerned from data relating to comparable components, stored user input (from database 120 or elsewhere, including both manual measurements and estimations), manufacturer specifications, et cetera.

Model component 130 provides process models to simulation component 140. Simulation component 140 assembles one or more models into a dynamic simulation (e.g. a simulation capable of being changed and updating to reflect the results of a change) and provides runtime support for simulated performance of processes 112. Simulation component 140 allows models of processes 112 to be applied, tested and solved for new variations. If simulation component 140 cannot assemble a complete simulation, simulation component can request additional or alternative models from model component 130. Alternatively, simulation component 140 can determine an analogous model or estimation to substitute for a precise model.

Simulation component 140 can solve or augment simulations based on at least different values for component-specific consumption data or sustainability factors. Different values for discrete, component-specific data can be received from sensors 112 or database 120. Values for component-specific data can also come from analogs or estimations, user input, a component of system 100, et cetera. Simulation component 140 is not limited to changing component-specific data relating to consumption or sustainability, but can also simulate addition, removal and modification of the equipment or hardware, inputs, outputs, et cetera associated with processes 112. For example, simulation component 140 can simulate a change in raw materials used in processes 112, or solve for results where shift labor is changed in relation to processes 112. Simulation component 140 can also provide for simulations influenced by external pressures, such as infrastructure (e.g. Smart Grid), regulation (e.g. cap and trade, usage penalties) or business conditions (e.g. changes to resource price).

In some aspects, simulation component 140 simulates modulation of production. Specifically, by changing line or facility production, net benefits can be realized where sustainability factors impact financial or other value positions more than a particular production quantity. Other changes to component application can be applied virtually by simulation component 140. Variables corresponding to the component or related resources pertinent to processes 110 can be altered. Changes to processes 112 or associated equipment or programming can include commissioning, decommissioning, cloning, consolidation or otherwise changing the component in a more profound sense than adjusting a subcomponent. Simulation component 140 can employ not only discrete, component-specific consumption data but can also operate in conjunction with traditional or aggregated metrics when processing simulations.

Simulation component 140 can also provide data to analysis component 142. Analysis component 142 can optimize one or more simulations for a set of variables including discrete consumption data and/or sustainability factor information. Variables can be optimized in terms of user or system preference. Variable priority can also be given default values. In some embodiments, analysis component 142 can determine a preferred state or states for processes 112 in view of an optimization or other information. Common methods of single or multivariable optimization can be employed to determine advantageous simulation states. Optimization methods can include combinatorial methods, derivative-free methods, first- and second-order methods, et cetera, and applications thereof (e.g. descent or ascent, gradient, Newton or quasi-Newton, simplex, line search). In some instances, constrained optimizations can be transformed to unconstrained optimization using Lagrange multipliers. These optimization techniques are only generally described for purposes example, and their detailing is considered non-exhaustive and non-limiting.

Analysis component 142 can employ artificial intelligence to assist with optimization or other analysis. For example, analysis component 142 can apply advanced mathematical algorithms (e.g. decision trees, neural networks, regression analysis, for configuration weight or probability determination; principal component analysis for feature and pattern extraction, cluster analysis, genetic algorithm, and reinforced learning) to analyzed information. Analysis component 142 can include or consist of artificial intelligence or knowledge or rule based components, sub-components, processes, means, methodologies, or mechanisms (e.g. support vector machines, neural networks, expert systems, Bayesian belief networks, fuzzy logic, data fusion engines, classifiers, et cetera). Such components, inter alia, can automate certain mechanisms or techniques performed thereby improve adaptability, efficiency and intelligence. Analysis can employ at least one of various methodologies for learning from data and then drawing inferences from the models so constructed.

By optimizing an entire simulation, analysis component 142 can efficiently identify improved component applications. For instance, analysis component 142 can discover whether it is more efficient to build a necessary item or buy it elsewhere. Analysis component 144 can determine whether the energy requirements are more efficiently met by on-site generation or purchase from utilities. Extending this example further, analysis component 142 can decide whether to sell back energy to a network (e.g. electrical grid) when sufficient generation or stores exist. If simulation component 140 controls data for an entire enterprise including multiple facilities, analysis component 142 can evaluate whether subsets of processes 112 are better performed at one facility instead of another, and can include the effects of regulation, pricing differences, environmental differences, et cetera in such an analysis. Analysis component 142 can additionally perform more common tasks, such as evaluating a simulation for scenarios that balance a load factor. Moreover, analysis component 142 can solve for sub-optimal scenarios where business objectives demand self-imposed limitations, or where external failures make "perfect" scenarios unworkable (e.g. infrastructure failures, utility shortfalls).

In addition, scenario component 144 can be used in conjunction with analysis component 142 and simulation component 140. Scenario component 144 can generate alternative scenarios, or alternative combinations of component applications, for processes 112 included in a simulation. For example, combinations of variables related to processes 112, or other simulation alterations, can be discerned proactively and evaluated by analysis component 142 to determine if a more advantageous component application or set of component applications is possible. Scenario component 140 can develop alternative simulations by applying any changes determined including but not limited to any model or simulation variances described supra. To limit the number of potential scenarios, constraints can be applied to limit scenario component 144 to discovery of scenarios or simulations that can actually be realized in practice. Constraints on scenario component 144 can include limits on process-specific consumption quantities or relating to sustainability factors. Constraints on scenario component 144 can also include common or practical concerns, including but not limited to process limitations, available materials or equipment, implementation or changeover time, process running time, floor space, cost, et cetera.

Simulation component 140 can additionally interface with other computers, industrial controllers, or export instructions for these or other devices. Simulation component 140 can thus rapidly deploy simulated states to real-world use. A plurality of recipes, instructions or arrangements can be stored in database 120 or elsewhere to assist with switching on a facility floor. In some embodiments, instructions for a particular component application can be applied or removed in real-time.

Simulation component 140 can incorporate controls and control programs for processes 112. Further, simulation component 140 can process line- or plant-wide changes and relationships including regular scheduling, planning for irregular events, prioritization, interoperability, et cetera. Simulation component 140 can accordingly facilitate updating and expansion of bills of materials or other documents or reports relating to the scheduling and throughput of processes 112. Bills of materials can include process-specific consumption data or information relating to sustainability factors and categorize such data as resources, materials and costs. Bills of materials can be updated to reflect changes committed from simulations performed by simulation component 140.

Data from simulation component 140 data can also be exported for utilization in other applications such as value stream mapping, accounting, or inclusion on batch or recipe file. Data from the simulation or consumption data can also be exported to other platforms for inclusion in higher-level calculations, such as to determine the complete costs and impacts of a particular component. In this way, consumption data and sustainability factors can be assessed alongside other enterprise resources such as labor and materials. Importation of simulation data can be affected by saving data in a recognizable format or putting stored values or functions in terms of units comprehensible by the importing platform. Alternatively, the target platform can be altered or updated to support other representations of sustainability factors.

Simulation component 140 provides an assembled simulation to user interface 150. Simulation component 140 can accumulate more than one process of processes 112 and aggregate modeling of individual components to capture an entire enterprise. Similarly, processes 112 or models from model component 130 can be decomposed into a series of sub-processes for like simulation and analysis. Sets of processes 112 can be integrated with other sets as new information becomes available or through data sharing. Simulation component 140 can simulate not only the independent data relating to a consumption point of processes 112, but can also take into account the impact one consumption point has on another and the relationships one component's sustainability factors have upon those of other components. Simulation component 140 can highlight or alert users to such relationships or the absence thereof.

User interface 150 provides for user input and facilitates display of simulation component 140 output and simulation data. Sensors 112, database 120, model component 130 and simulation component 140 can store or prepare component-specific consumption data for importation to or manipulation in a variety of interface environments. In some embodiments, user interface 150 can be managed in a simulation suite such as Rockwell Arena™ or other common software package. Where possible, this data can also be utilized by or exported to complementary software systems (e.g. Rockwell FactoryTalk™ modules, Rockwell RSEnergy™, Rockwell RSPower™, et cetera). Alternatively, user interface 150 can be accessed via a platform-independent or native interface such as a web browser. Accordingly, user interface 150 can be provided locally (stored on resident drive, direct connection, single closed system, et cetera) or exist remotely (at another computer, within a local network or distributed computing environment, on the Internet, et cetera) for display in a browser. Finally, the simulation can be generated and controlled by means of standalone software.

It is noted that components associated with the system 100 can include various computer or network components such as servers, clients, controllers, industrial controllers, programmable logic controllers (PLCs), batch controllers or servers, distributed control systems (DCS), communications modules, mobile computers, wireless components, control components and so forth that are capable of interacting across a network. Similarly, the term controller or PLC as used herein can include functionality that can be shared across multiple components, systems, or networks. For example, one or more controllers can communicate and cooperate with various network devices across the network. This can include substantially any type of control, communications module, computer, I/O device, sensors, Human Machine Interface (HMI) that communicate via the network that includes control, automation, or public networks. The controller can also communicate to and control various other devices such as Input/Output modules including Analog, Digital, Programmed/Intelligent I/O modules, other programmable controllers, communications modules, sensors, output devices, and the like.

Network and communications interfaces utilized in conjunction with system 100 can include public networks such as the Internet, Intranets, and automation networks such as Control and Information Protocol (CIP) networks including DeviceNet and ControlNet. Other networks include Ethernet, DH/DH+, Remote I/O, Fieldbus, Modbus, Profibus, wireless networks, serial protocols, and so forth. In addition, the network devices can include various possibilities (hardware or software components). These include components such as switches with virtual local area network (VLAN) capability, LANs, WANs, proxies, gateways, routers, firewalls, virtual private network (VPN) devices, servers, clients, computers, configuration tools, monitoring tools, or other devices.

It is noted that as used in this application, terms such as "component," "module," "procedure," and the like are intended to refer to a computer-related entity, either hardware, a combination of hardware and software, software, or software in execution as applied to an automation system for industrial control. For example, a component can be, but is not limited to being, a process running on a processor, a processor, an object, an executable, a thread of execution, a program and a computer. By way of illustration, both an application running on a server and the server can be components. One or more components can reside within a process or thread of execution and a component can be localized on one computer or distributed between two or more computers, industrial controllers, or modules communicating therewith.

As used herein, the term "sustainability" is intended to assess alternative cost measures for a given process, product or plant element. For example, sustainability factors include utilities, energy, byproducts (e.g. emissions, waste, excess, effluent), sanitation concerns, safety, maintenance burden, component or subcomponent longevity, corporate responsibility, fair labor, and/or other outputs, effects, metrics or perceptions of sustainability, et cetera. "Process-specific sustainability data" or other similar terminology is used to describe the impact of a process or component, or a change to the process or component, based upon sustainability factors (e.g. a particular part or technique's byproducts, energy use, hidden costs, et cetera). As used herein, "energy" can impute use or consumption of energy, generation of energy, net result of energy input and output, different forms of energy, et cetera. Energy can generally include water, air, gas, electricity, steam ("WAGES") and other consumed resources delivered to a component or process (e.g. liquid nitrogen). Generally, other consumed resource energy will be applied by the component and is not incorporated in the system's deliverable. However, in some embodiments, the energy can be incorporated into a deliverable or output. Discussion of byproducts including waste output, effluent, excess and other sanitation concerns is intended to encompass all consequential results, outcomes, pollutants, environmental impacts and sanitation concerns, at all levels (e.g. sub-component cleanliness to regional macro-environmental impact, et cetera), and is not considered an exhaustive listing.

Sustainability or sustainability factors can be used to calculate, aggregate or analyze a "sustainability score." The sustainability score can be a relative measure that serves as an indicator to a facility or organization of how effectively the entity is addressing its goals relating to sustainability. The sustainability score can include human factors or initiatives directed toward the development and furtherance of goodwill and corporate citizenship. For example, an organization may seek to improve local quality of life in an area surrounding a facility. Such goals are qualitative and in some instances do not directly influence quantitative sustainability measures (e.g. do not affect amount of materials required or amount of waste per process, unit production, et cetera) but are nonetheless valuable to include in composite assessments. In another example, employee work assignments could be optimized to best allocate tasks in accordance with standardized assignment rules such as preventing assignments to unqualified operators or support other human resources goals such as employee education, work diversity, life balance, organizational satisfaction, et cetera. Factors or sub-scores affecting the sustainability score can be qualitative or quantitative. Quantitative factors may take a variety of forms, including binary or mathematically discrete/integral (e.g. 1 for assigned, 0 for not assigned), or continuous. Quantitative sustainability factors may also be solved as a function of other inputs. Aspects affecting the sustainability score can additionally be dependent upon other aspects. Weights can be assigned to focus a sustainability score on particular factors. In some instances, multiple sustainability scores can be employed by a plurality of sub-entities within a single organization or facility.

"Consumption data" is intended to refer to the discrete resource consumption of a facility set or subset (e.g. whole facility, facility area, area process, process component, subcomponent, et cetera) in a specific state. For greater clarity, consumption data is additionally described as "discrete consumption data," "component-specific consumption data," "process-specific consumption data," et cetera. In particular, discrete consumption data refers to a consumption value associated with a discrete component or process in agreement with what is described herein. Consumption data can be measured at a specific consumption point or a plurality thereof. "Consumption point" refers to any component, process or subset thereof to which some particular consumption, byproduct or other impact on sustainability can be discretely attributed. No particular scheme or structure need be adhered when selecting a point or points of consumption at which to measure consumption data. The discrete consumption of the set or subset is intended to refer to all inputs and outputs of the set or subset, including alternative measures (e.g. sustainability factors, energy and environmental usage or costs, et cetera), and can be directly associated with the specific state relating to the set or subset (e.g. production rate, production quantity, process speed, process labor, time, quality, inputs, outputs, et cetera) and any variables inherent thereto. Consumption data is measured, aggregated, organized and stored in multiple resolutions or granularities, and can be used to identify costs or usage associated with any component at any discernible resolution (e.g. any resolution or level at which sensors, metrics, estimators, et cetera are employed to record consumption). Consumption data can relate to not only to an absolute total of consumption at a given granularity, but how consumption (or changes in sustainability factors) rates correlate to production, component applications, process state, other component activity, et cetera. Further, while consumption generally implicates the concept of an input that is used and exhausted, as used herein consumption can be construed liberally to include the generation of byproducts, an increase in maintenance burden, shortened service life, and other facets with which some cost, time or effort can be connected.

While sustainability and consumption are frequently approached herein from component-specific or consumption-point perspectives, it is understood that some sustainability factors are influenced by general overhead or external means. Relationships between a component and another component, its facility, environment, et cetera can both influence the sustainability and consumption of the first component and the overall sustainability and consumption of its production environment. Accordingly, non-associated or generalized sustainability and consumption can still be realized and accounted for under this construction. Such overhead is incorporated and can be used with, and in some instances independent of, component-specific or consumption-point data.

"Component application" is the way in which a facility component, subcomponent, set of components, et cetera is employed or used. As used, this can also refer to a process (as a constituent of a process line, system, plant, et cetera) and its states, variables and settings. For example, a component application can include changing a process speed or rate, inputs or outputs, associated labor, scheduling or timing, et cetera. Alternative component applications can include modulating production (e.g. total line or facility product output). A component application can include decommissioning of equipment or a piece of equipment in some solutions. Alternatively, a component application can include cloning of a component to run another. Component application can focus not only on core use of a component, but also addressing of peripheral considerations such as setup, changeover, uptime or downtime, service life, maintenance burden, component interoperability, priority, et cetera. A "production environment" or "facility setting" is a working implementation of a series of component applications, as compared with a simulation environment that has been evaluated electronically but not implemented in operative practice. An "external environmental factor" is an influence relating to the environment external to a facility setting, such as weather.

Figure 2:
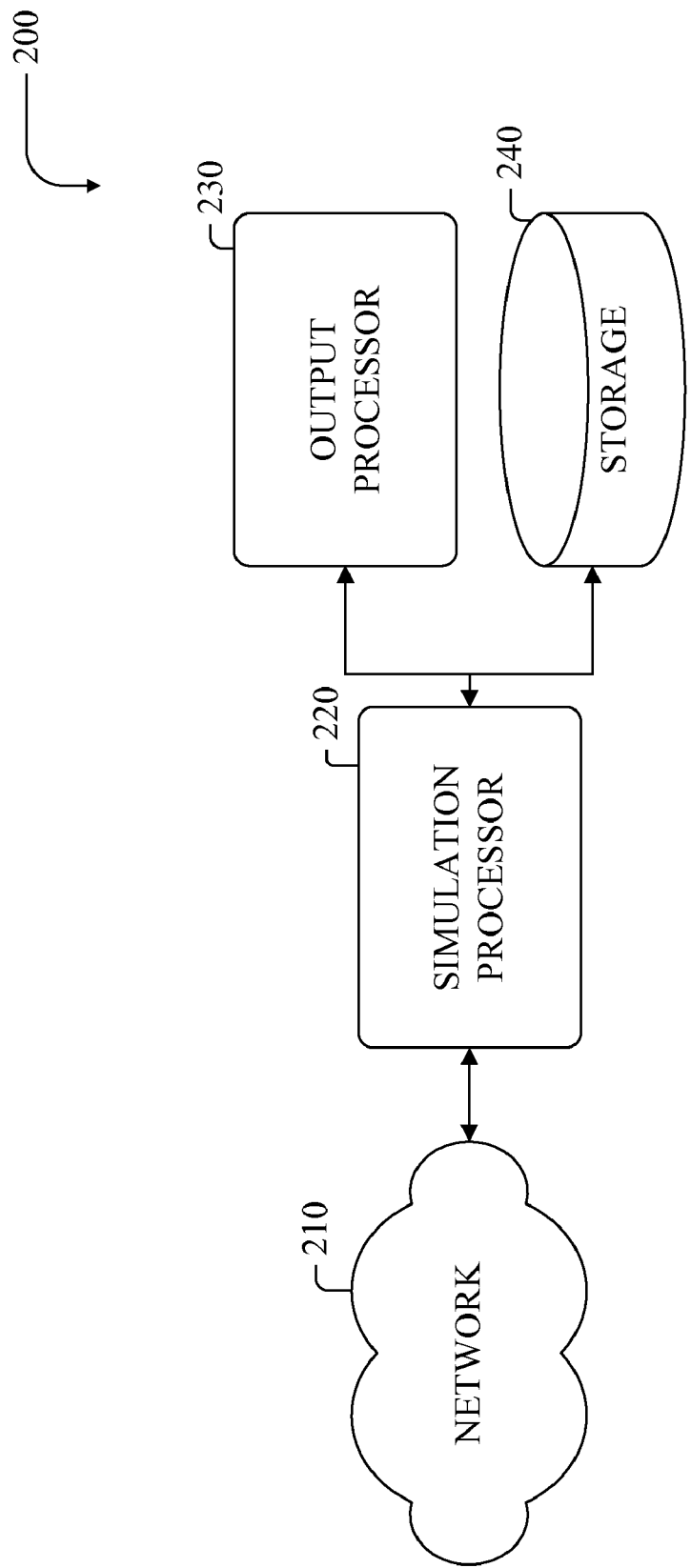
FIG. 2 is a diagram illustrating an example system for simulating processes using data from a network.

Turning now to FIG. 2, an example system 200 illustrates another embodiment for simulating systems in terms of discrete, component-specific consumption. Network 210 can be substantially any network, or a plurality of networks, that transmits data from remote or distributed storage. Simulation processor 220 is provided with or requests data relating at least partially to discrete consumption data or sustainability. Data can be provisioned from network 210 at any time, and simulation processor 220 can be updated refreshed with new data before, during or between active processing.

Simulation processor 220 can perform modeling and simulation assembly as described supra in FIG. 1. In addition, simulation processor 220 can perform analysis, optimization and scenario generation. Simulation processor 220 can modify a simulation for purposes of analysis, based upon user input, or to perform other calculations on the simulation. Simulation processor 220 can query network 210 for additional information if a simulation lacks complete data. Simulation processor 220 can act as a gap-filler by substituting reasonable estimations if there is insufficient data to properly model a constituent of a simulation. Estimations or substitutes can be based upon elements with similar discrete consumption or process-specific sustainability attributes. Estimates where sensor data is thin can also be provided by stored defaults, user input, deductive calculations (e.g. observing from a higher level, eliminating known values and assigning or averaging remainders), et cetera.

Simulation processor 220 can mirror an existing production environment to resolve uncertainties. If an active system or process is new or has not been thoroughly analyzed, simulation processor 220 can assemble an appropriate simulation to determine consumption forecasts relating to the system or process. If difficulties exist in modeling portions of the system or process, simulation processor 220 can analyze a high-level model and known components to ascertain the desired details.

Simulation processor 220 can create simulation templates or recipes based upon component applications or other modification detailed via one or more simulations. Templates can be stored in a form that is easily managed by simulation processor 220 to restore previous simulations at a later time. Alternatively, templates can be saved in a format for export, or in controller programming for ease of implementation in a production environment.

Simulation processor 220 can store data from network 210, simulation templates or recipes, and subsequently processed information in storage 240. Storage 240 can also contain other reusable information relating to simulation processor 220 or output processor 230 such as options, preferences, et cetera. In some embodiments, storage 240 can itself be directly connected to network 210 (connection not shown).

Output processor 230 can include a user interface. A user interface associated with output processor 230 can be realized through existing software interfaces, a web interface, or a dedicated software package. Output processor 230 can also manage all interface actions, and passes user behavior back to simulation processor 220.

Figure 3:
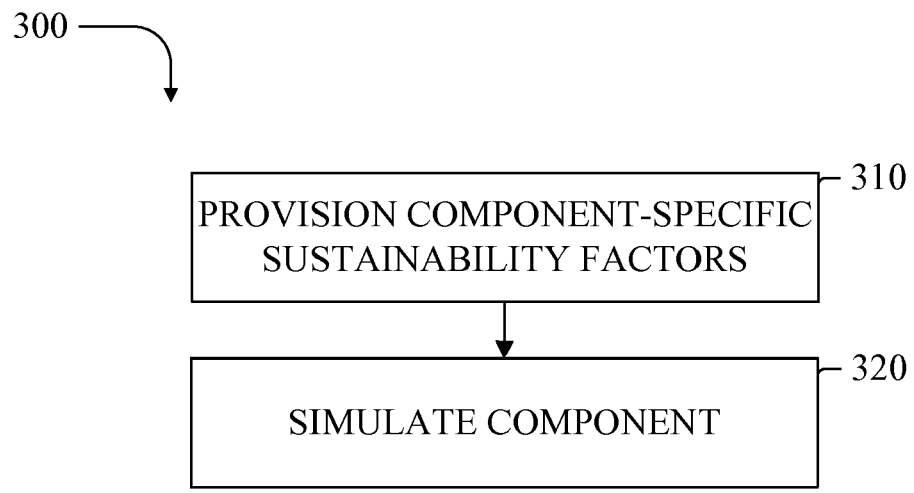
FIG. 3 is a flow diagram illustrating an example method for simulating a component using sustainability factors relating to the component.

Turning now to FIG. 3, an example method 300 illustrates simulation of a component based upon component-specific sustainability factors. At 310, component-specific sustainability factors are provisioned. As used herein, provisioning is intended to encompass receipt, discernment or acquisition by substantially any means. For example, provisioning could include a device performing measurement or calculation independently, receiving information directly from another sensor, and/or requesting information from intermediary equipment, networks or storage. The provisioned factors can be obtained from one or more of a plurality of sources, including but not limited to sensors that are active at the time of model processing, stored information previously recorded via sensors (including now-inactive or subsequently-removed sensors), estimated data discerned from data relating to comparable components, stored user input, manufacturer specifications, et cetera. Provisioned component-based sustainability factors can also employ other data types to improve a simulation (e.g. to better discern relationships between components).

At 320, the component is simulated based at least in part upon the component-specific sustainability factors. The component associated with the component-specific sustainability factors is represented analytically and loaded into a simulation that replicates and reacts to changes as does the live component in a production environment. The simulation can then be altered to ascertain possible changes to the simulated component, and particularly the impact of the changes on sustainability factors as affected by the component.

While, for purposes of simplicity of explanation, methodologies are shown and described as a series of acts, it is to be understood and appreciated that the methodologies herein are not limited by the order of acts, as some acts may occur in different orders or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology as described herein.

Figure 4:
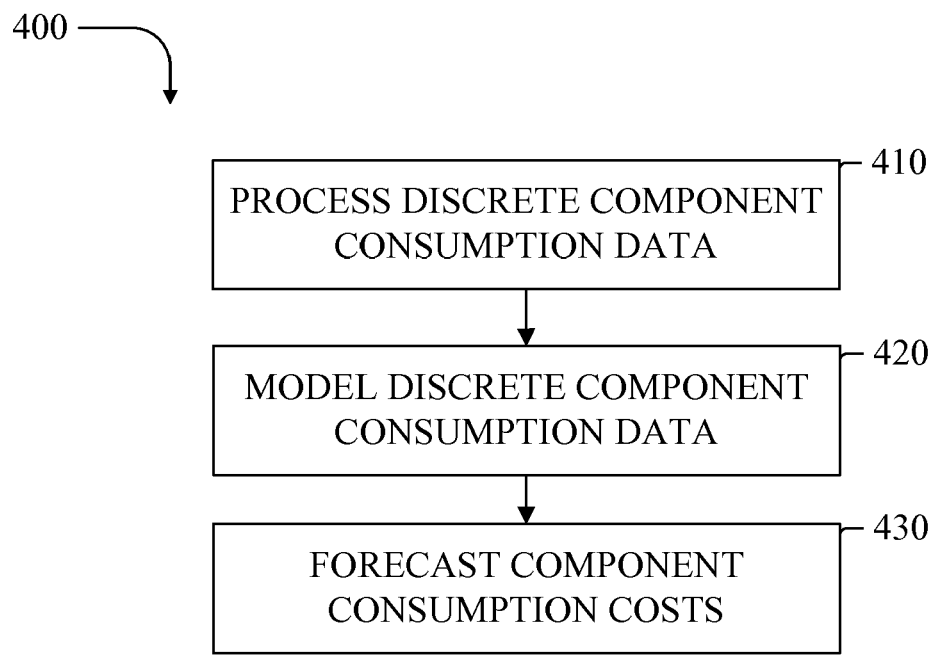
FIG. 4 is a diagram illustrating an example method for component consumption forecasting.

Turning now to FIG. 4, an example method 400 illustrates the forecasting of component consumption costs by way of modeling the component using at least discrete component consumption data. At 410, discrete component consumption data is processed to set up modeling of the component. Data processed can include consumption quantities and characteristics attributable to the component for a plurality of resources in one or more component applications and/or variable states. Pertinent data can also include information that illuminates correlation between the component and other system element, the transaction costs of a system (e.g. electrical transmission losses, fluid head loss, et cetera), and other aspects that ultimately affect the operation of the component to be modeled.

At 420 the component is modeled based at least in part upon processed consumption data. It is understood that multiple models for a plurality of components can be generated at 420. Modeling techniques employed can include, but are not limited to, those described supra.

At 430, component consumption costs are forecast based upon the generated component model, and other information that can include a component application, production environment, the state of variables and other influences on the component. Forecasts can include computations, predictions, valuations or other representations of future or expected consumption, cost, creation or output of energy or other calculable (including qualitative assessment) sustainability accounts. Forecasting at 430 can be performed to or for a plurality of components, enabling further analysis including detection of interrelatedness, summing of totals and deduction of involvement from non-observed components. Similarly, forecasting at 430 can be performed a plurality of times on a single component. Multiple forecasting 430 iterations can confirm or support forecasts in a particular component application, or illustrate the benefits and drawbacks of different of various contingencies with respect to multiple component applications.

Forecasts can be utilized to plan for energy needs under specific contingencies. Forecasts can also ensure sufficient resources are available and negotiate rates or broker amounts of resources from providers. In some instances, an automated system can be provided that transmits forecasts to suppliers to ensure adequate consumables or credits are available, or to allow updating or negotiating of pricing for resources. Further, a forecasting system can decide where to provision consumables from (e.g. a specific supplier from a plurality, generate on-site, acquire from another facility, et cetera) based upon forecasts and known rates, costs or negotiations. Decisions of when, where and how to acquire one or more resources can be automated and resolved according to inference, rules, protocols, constraints, calculations or other programmatic means.

Turning now to FIG. 5, an example method 500 illustrates the optimization of a component in view of utilization or costs associated specifically with the component. Component-specific sustainability factors data is received at 510. This data can include any information relating to sustainability, and in particular calculable (including qualitative assessment) values that can be utilized by electronic component modeling techniques. At 520, the component is simulated. Simulation of the component generally includes at least calculations relating to sustainability factors. However, in some instances, certain components included in a simulation can exclude such aspects.

At 530, the component simulation is analyzed. Analysis can include determination of valuable scenario elements and assignment of priorities or weights. Alternative component applications or settings can be investigated, and the scenario is effectively primed to apply optimization techniques. At 540, the scenario is optimized. Optimization can be performed in view of inferred preferences, default priorities or user input relating to goals or ends sought in optimizing the simulation. Variable prioritization can assist in optimizing sustainability in view of uncontrollable limits upon a facility or organization, and can determine, for example, whether component application should be altered, improved or attenuated, whether low-value components can be removed or replaced, and whether high-value components can be duplicated. Such optimization can be made in view of component-specific sustainability factors, or sustainability factors affecting the entire simulation.

At 550, a report is generated. The report can contain information relating to the simulation, scenarios analyzed, and optimization processing and/or results. The report can be a summary or alternatively an exhaustive description of the information and other aspects. The report can be customized based on inference or user preferences, or can rely on default settings to determine its content or presentation. In some instances, the report can be instructions on how to accomplish the optimized scenario in a production environment. The report can be or include control programming to disseminate among one or more components to alter a component application. As used herein, a "control program" can be any electronic means (e.g. software code, PLC logic, batch or recipe files, et cetera) of managing, instructing or controlling an industrial controller or equipment influenced thereby. The new component application can reflect, for example, a scenario or changes to the simulation performed during analysis, optimization or through user input. The report can additionally include specific coordinating particulars to minimize cost, risk or other burdens associated with changing a production environment. The analysis and report can contemplate not only production environment considerations, but also constraints relating to regulation, infrastructure (e.g. utilities), resource costs (static or dynamic), et cetera. Additionally, changes in external environmental factors (e.g. weather) can be considered in both analysis and reporting.

Turning now to FIG. 6, an example method 600 illustrates the determination and implementation of alternative consumption options utilizing a consumption model based at least in part upon discrete consumption data. At 610, consumption data is received. Consumption data can be recent stored data, or archived/historical stored data. Alternatively, consumption data can be received directly from sensors, and either processed real-time or compiled. Additionally, consumption data can be a forecast or estimate directed towards future usage. Consumption data refers to any resource used at a consumption point or by equipment or process, including energy such as electricity or gas. Byproducts can also be included under the rubric of consumption, as these aspects can have related costs.

At 620, a consumption model is simulated. The simulation includes identification of variables and possible changes, as well as the capability to alter these and update the simulation accordingly. Consumption data can be altered to determine how the simulation must change to reach the specified consumption characteristics. Similarly, other aspects of the simulation can be modified and resultant consumption data updated. Neither function is exclusive, and both can be utilized at once during simulations.

At 630, one or more alternate consumption scenarios are generated. Scenarios are alternative combinations, sets and arrangements of simulated component applications and facets affecting those components or the simulated production environment. Scenarios can be viewed or evaluated at any resolution or granularity applicable to the simulation. After a scenario is generated, a determination is made whether to implement the scenario at 640. The decision can be made in substantially any way, including computational inference, a preexisting setting, or user input. If the scenario is rejected, another scenario can be generated and/or considered for implementation.

If the scenario is to be implemented, new control data and transition warnings are provided for deployment of the selected scenario. Control data can include general or specific information on one or more means of applying the selected scenario. Control data can also include component or process programming such as instructions for programmable logic controllers. Transition warnings alert systems or users to risks associated with implementation of the new scenario (e.g. energy spikes and peak usage penalties, increased byproduct output, other sustainability or general concerns). Transition warnings can utilize substantially any means of conveying the warning to a device or person facilitating implementation. If a device receives a transition warning notifying the device of a broken constraint, the device can interrupt the implementation to prevent an unacceptable result. Alternatively, the implementation can have priority and override a standard threshold. Other decisions, means and resolutions to conflicts as to proceed or interrupt when an implementation conflict is encountered can be determined using computed inference, custom or default priorities, rules, protocols, et cetera. Alternatively, the implementation can pause until a user resolves the conflict.

Figure 7:
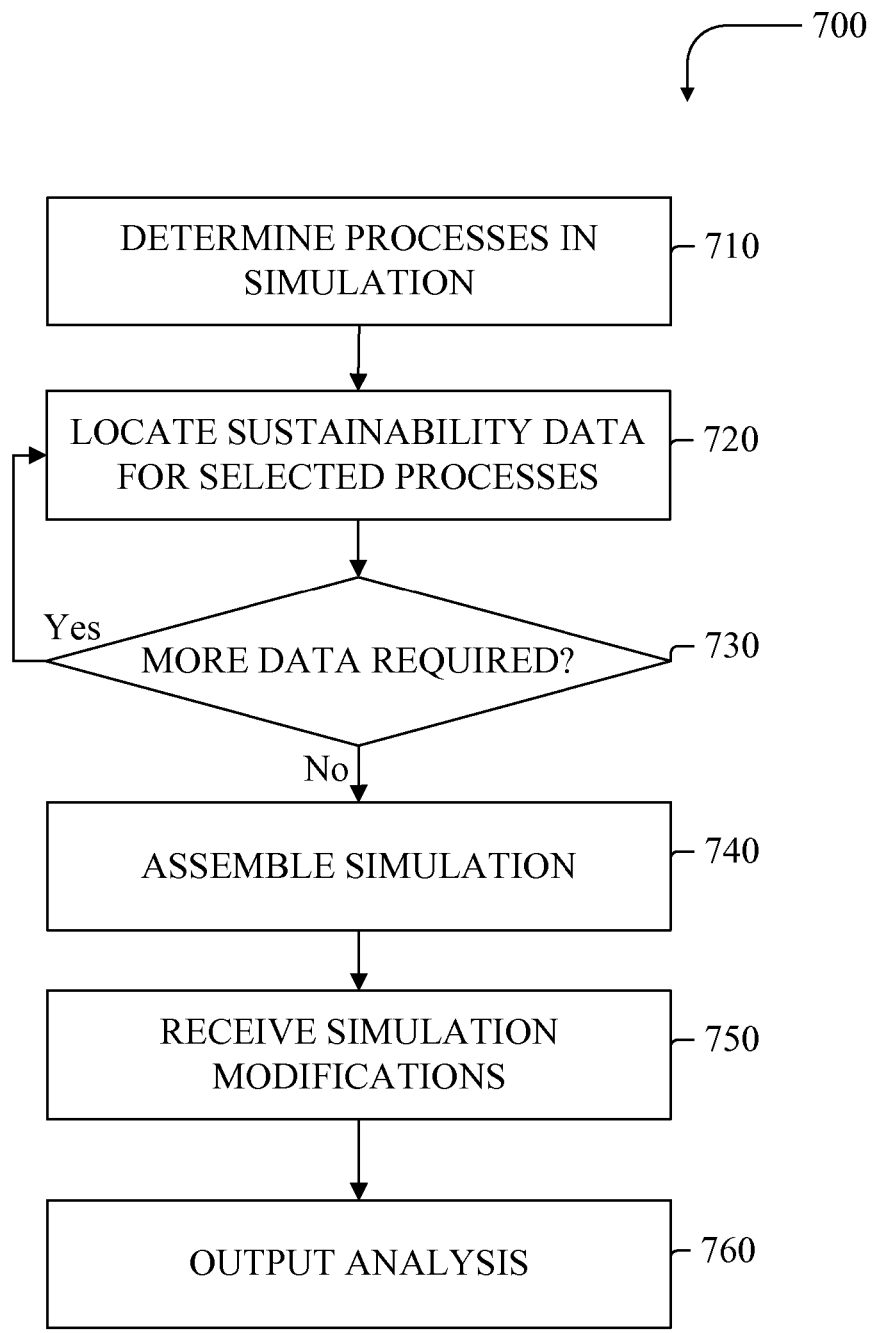
FIG. 7 is a diagram illustrating an example method of providing alternative component application based upon modeling of one or more components in terms of consumption data.

Turning now to FIG. 7, an example method 700 illustrates use of a dynamic, multi-component simulation to allow users to experiment with alternative component applications or automatically determine solutions to alternatives or constraints. At 710, the processes to be used in the simulation are determined, and an appropriate scope of simulation is set. Even where the simulation is limited in scope, it is possible to explicitly or implicitly include or exclude other aspects either within our outside of the simulation scope. At 720, sustainability data relating to the determined processes is located to facilitate creation of the simulation.

At 730, a determination is made whether sufficient data exists to assemble the simulation. If there is not sufficient data to assemble the simulation as described by the selected processes, another iteration of locating sustainability data can be employed. If no data can be located relating to the specific process, data relating to an analogous process can be located. Where appropriate sustainability data is challenging to locate, increasingly generalized approximations can be sought with each subsequent location attempt. For example, location attempts can proceed to employ data relating to more dissimilar processes over long search times. Alternatively, location attempts could eventually allocate all, a portion, a weighting or an average of overhead or general sustainability data. These examples are not comprehensive, and other search, inference and estimation techniques can be employed to determine what data to apply to the simulation.

Once appropriate data is located, the simulation is assembled at 740. The simulation is modified for one or more changes possible in a production environment at 750, and the simulation is updated to reflect the results of modification. At 760, analysis results are output. Output can include, for example, updating the values of variables when one is changed, altering text or graphics representing a simulation in an interface, updating information relating to the simulation, generating or changing controller instructions, or other behaviors for utilization of the results. Output can be via substantially any means, including visual, audible, tactile, et cetera.

Figure 8:
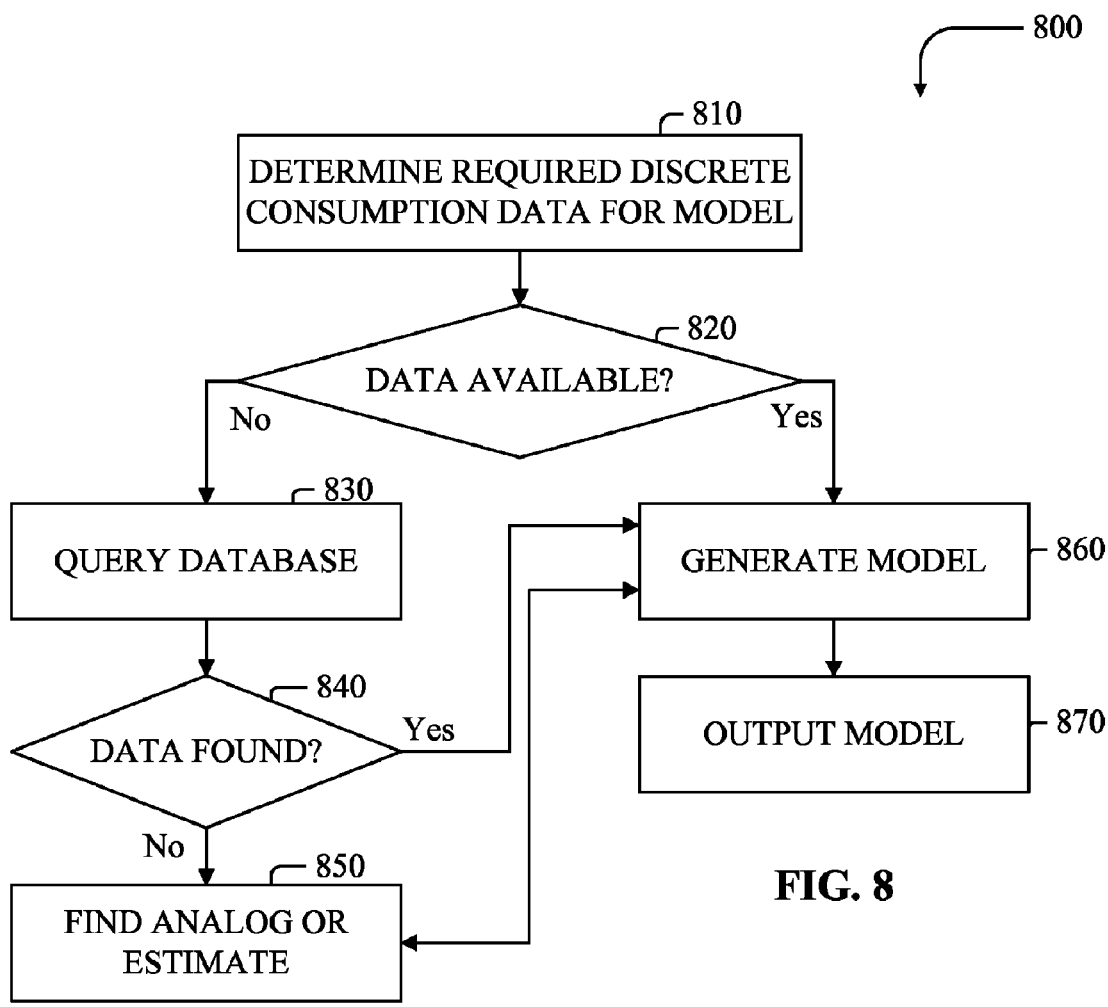
FIG. 8 is a diagram illustrating an example method for modeling a component in terms of actual or estimated discrete consumption data.

Turning now to FIG. 8, an example method 800 illustrates modeling of a component at a consumption point using actual consumption data or comparable estimates. At 810, a determination is made regarding what discrete consumption data is required for a model. At 820, a decision is made as to whether the required data is available. If the required consumption data is available, a model can be generated 860. However, if required data is unavailable, a database can be queried at 830 to locate consumption data. The database can be substantially any type of storage appropriate for managing consumption data. The database can be queried using substantially any appropriate query or search technique. It is appreciated that the database can in fact be a plurality of databases, and that a query can be a plurality of queries.

After querying the database at 830, another decision is made at 840 as to whether appropriate data was found. If appropriate data was located in the database at 830, a model can be generated at 860. If appropriate data is still lacking, an analog or estimate can be located at 850 to allow modeling to proceed. Estimations or substitutes can be based upon elements with similar discrete consumption or process-specific sustainability attributes. Estimates where appropriate consumption data is unavailable can be provided by stored defaults, user input, arbitrary allocations, deductive calculations (e.g. observing from a higher level, eliminating known values and assigning or averaging remainders), et cetera. Alternatively, an estimate can be based on "stale" consumption data that no longer reflects a device or practice with great accuracy but will suffice to fill gaps in a model.

Once required data is provided, a model is generated at 860. The model can then be manipulated and utilized to provide output relating to the model at 870.

Figure 9:
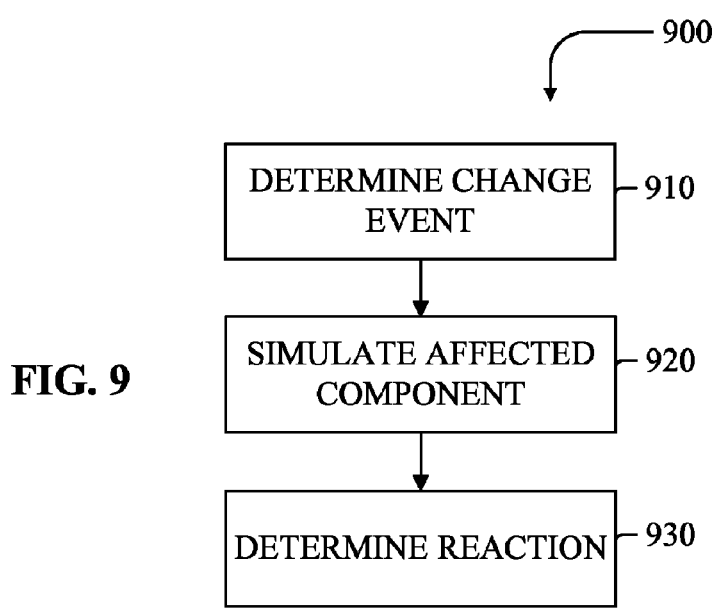
FIG. 9 is a diagram illustrating an example method for planning reactions to change events.

Turning now to FIG. 9, an example method 900 illustrates determining one or more preferred reactions to a change event in view of how the change event affects the specific component. As used herein, "change event" is intended to include any event that places a new constraint, physical or intangible, on an enterprise or any subset or subcomponent thereof. Change events or response to change events can be influenced by sustainability factors and/or consumption data. Examples of change events include, but are not limited to, new regulation (e.g. cap-and-trade emissions), new infrastructure (e.g. Smart Grid energy), new or changing costs (e.g. taxes, variable energy cost rates, peak-usage penalties), utility failures (blackouts, brownouts, shortages, pipe failures), voluntary action (environment days, corporate citizenship), or any other event that causes change in a component application. For example, emissions trading in the United States could dramatically alter the industrial landscape in terms of the complexity and cost of regulatory compliance. In another example a plant change can be underway requiring appreciation of peak energy usage to prevent penalties during implementation.

At 910, a change event is determined. It should be appreciated that multiple change events can be determined and evaluated simultaneously. Determination of the change event can include deciding whether to plan for (e.g. new implementation) or around (e.g. emissions cap) a change event. Change events can inferred in view of system awareness of all influences on an enterprise. Alternatively, change events can be disseminated to systems or users from a master server (e.g. corporate headquarters) or a body in control of the change event (e.g. government, private utility). In still another case, change events can be input by a user. At 920, at least one component affected by the change event is simulated. The simulation can employ analysis of component-specific consumption or sustainability factors. Once the simulation is organized at 920, an appropriate reaction is determined at 930 to minimize or optimize the impact of the change event. An appropriate reaction can be an optimization in view of new constraints or containment efforts relating to cost, consumption or output. A reaction can be temporary, periodic or permanent. The reaction can be presented to a user, or automatically implemented.

The subject matter as described above includes various exemplary aspects. However, it should be appreciated that it is not possible to describe every conceivable component or methodology for purposes of describing these aspects. One of ordinary skill in the art can recognize that further combinations or permutations can be possible. Various methodologies or architectures can be employed to implement the subject invention, modifications, variations, or equivalents thereof. Accordingly, all such implementations of the aspects described herein are intended to embrace the scope and spirit of subject claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for simulating a production environment, comprising:
    employing a data processor to execute the following instructions:
        provisioning discrete energy consumption data relating to a component of the production environment, wherein the component is a subset of the production environment;
        simulating the component, wherein an input or output variable of the simulation includes at least the discrete energy consumption data relating to the component;
        decomposing the simulated component into constituent elements;
        associating a portion of the discrete energy consumption data relating to the component to each constituent element; and
        varying resolution of the component by decomposing or reassembling the simulated component, and summing or separating associated portions of the discrete energy consumption data relating to the component.

2. The method of claim 1, further comprising forecasting future discrete energy consumption data based upon analysis of the simulated component.

3. The method of claim 1, further comprising solving for discrete energy consumption data relating to the component in the production environment based upon the simulation.

4. The method of claim 1, further comprising optimizing the simulation.

5. The method of claim 4, wherein optimizing the simulation optimizes the discrete energy consumption data relating to the component by varying one or more attributes of the component or the production environment.

6. The method of claim 4, wherein optimizing the simulation optimizes one or more attributes of the component or a facility setting by varying the discrete energy consumption data relating to the component.

7. The method of claim 1, further comprising generating an alternative component application for the component.

8. The method of claim 1, wherein simulating the component includes determining a relationship between the discrete energy consumption data relating to the component and at least one of another component, the production environment or an external environmental factor.

9. A system for modeling industrial components, comprising: at least one processor coupled to memory retaining instructions carried out by the at least one processor;
    means for acquiring data influencing sustainability factors relating to the industrial components, the sustainability factors comprise data pertinent to a subset of one or more of the industrial components that produces a distinct output, wherein the data is representable in different resolutions; and
    means for generating a virtual model of the industrial components that calculates consumption data based on an input condition, wherein the input condition comprises sustainability data for an additional component of the subset of the industrial process, wherein generating the virtual model comprises varying resolutions of the industrial components by decomposing or reassembling the industrial components, and summing or separating portions of the consumption data relating to the industrial components.

10. The system of claim 9, further comprising means for forecasting future consumption data based upon analysis of the industrial components.

11. The system of claim 9, further comprising means for optimizing the virtual model.

12. The system of claim 11, wherein optimizing the virtual model optimizes the consumption data relating to the industrial components by varying one or more attributes of the industrial components.

13. The system of claim 11, wherein optimizing the virtual model optimizes one or more attributes of the industrial components or a facility setting by varying the consumption data relating to the industrial components.

14. A system for optimizing operations, comprising: at least one processor coupled to memory retaining instructions carried out by the at least one processor;
- a simulation component that generates a simulation including energy consumption data of a group of discrete components used in operations and one or more sustainability factors associated with the operations, wherein the simulation can be modified to represent a state of a plurality of operations in different resolutions by decomposing or reassembling the discrete components and summing or separating associated portions of the energy consumption data relating to the discrete components; and
- a score component that calculates a sustainability score associated with the state of operations based at least in part on the sustainability factors.

15. The system of claim 14, wherein the one or more sustainability factors includes human factors.

16. The system of claim 14, wherein the one or more sustainability factors includes a qualitative goal.

17. The system of claim 14, wherein the simulation component forecasts future energy consumption data based upon analysis of the discrete components.

18. The system of claim 14, wherein the simulation component solves for energy consumption data relating to the discrete components based upon the simulation.

19. The system of claim 14, wherein the simulation component optimizes the simulation.

20. The system of claim 19, wherein optimizing the simulation optimizes the energy consumption data relating to the discrete components by varying one or more attributes of the discrete components.

21. The system of claim 19, wherein optimizing the simulation optimizes one or more attributes of the discrete components or a facility setting by varying the energy consumption data relating to the discrete components.

* * * * *